(12) United States Patent
Hu

(10) Patent No.: US 9,799,616 B2
(45) Date of Patent: Oct. 24, 2017

(54) PACKAGE SUBSTRATE WITH DOUBLE SIDED FINE LINE RDL

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/389,540

(22) Filed: Dec. 23, 2016

(65) Prior Publication Data

US 2017/0263579 A1 Sep. 14, 2017

Related U.S. Application Data

(60) Provisional application No. 62/305,133, filed on Mar. 8, 2016.

(51) Int. Cl.
*H01L 23/52* (2006.01)
*H01L 23/00* (2006.01)
*H01L 23/498* (2006.01)
*H01L 21/48* (2006.01)

(52) U.S. Cl.
CPC .......... *H01L 24/02* (2013.01); *H01L 21/4846* (2013.01); *H01L 23/498* (2013.01); *H01L 23/49827* (2013.01); *H01L 24/06* (2013.01); *H01L 2224/0231* (2013.01); *H01L 2224/02331* (2013.01); *H01L 2224/02373* (2013.01); *H01L 2224/0612* (2013.01)

(58) Field of Classification Search
CPC ............. H01L 23/49827; H01L 23/498; H01L 21/4846; H01L 24/02; H01L 24/06
USPC ........................................................ 257/774
See application file for complete search history.

(56) References Cited

U.S. PATENT DOCUMENTS

| | | | | |
|---|---|---|---|---|
| 7,838,337 B2* | 11/2010 | Marimuthu | ........... | H01L 21/565 257/E21.5 |
| 7,858,441 B2* | 12/2010 | Lin | .................... | H01L 23/49816 438/107 |
| 8,754,514 B2* | 6/2014 | Yu | ..................... | H01L 23/49816 257/686 |
| 8,889,484 B2* | 11/2014 | Chen | ...................... | H01L 24/19 438/106 |

\* cited by examiner

*Primary Examiner* — Luan C Thai
(74) *Attorney, Agent, or Firm* — JCIPRNET

(57) ABSTRACT

A package substrate has a sandwiched redistribution layers is disclosed. A middle redistribution layer functions as a core redistribution layer sandwiched by a top redistribution layer and a bottom redistribution layer. A top surface of the top redistribution layer is made adaptive for at least one chip to mount, and a bottom surface of the bottom redistribution layer is made adaptive for at least one chip to mount. A line width of each circuit of the middle redistribution layer is wider than a circuit of either the top redistribution layer or the bottom redistribution layer.

7 Claims, 8 Drawing Sheets

PACKAGE SUBSTRATE WITH DOUBLE SIDED FINE LINE RDL

RELATED APPLICATIONS

The present application claims the benefit of U.S. Provisional Application No. 62/305,133, filed Mar. 8, 2016, the disclosure of which is hereby incorporated by reference herein in its entirety.

BACKGROUND

Technical Field

The present invention relates to a package substrate, especially relates to a package substrate with double sided fine line redistribution layer (RDL) for a system in package. The top side of the package substrate is made adaptive to mount at least one chip thereon. The bottom side of the package substrate is made adaptive to mount at least one chip thereon. The line width of a metal circuit of the middle redistribution layer is wider than a line width of a metal circuit of the top redistribution layer, and the line width of a metal circuit of the middle redistribution layer is wider than a line width of a metal circuit of the bottom redistribution layer.

Description of Related Art

FIG. 1 shows a prior art.

FIG. 1 shows that a first chip 501 and a second chip 502 are configured on a top side of an interposer 51. The interposer 51 is configured on a top side of a package substrate 52. The package substrate 52 is configured on a system board 53. For signal communication between the first chip 501 and the second chip 502, a long path needs to go as indicated by the dash line 55. Referring to FIG. 1, the communication path from chip 501 to chip 502 goes from the circuitry of the interposer 51, package substrate 52, system board 53, back to the package substrate 52, the interposer 51, and then reaches chip 502. The disadvantage for the prior art is that the longer the path it goes, the weaker the signal is received. For a long time, a shorter circuitry for signal communication between neighboring chips is pursued.

DETAILED DESCRIPTION OF THE INVENTION

A package substrate has a middle redistribution layer functions as a core redistribution layer. The middle redistribution layer is sandwiched by a top redistribution layer and a bottom redistribution layer. A top surface of the top redistribution layer has a plurality of top metal pads adaptive for at least one chip to mount, and a bottom surface of the bottom redistribution layer has a plurality of bottom metal pads adaptive for at least one chip to mount, a compact system in package can be achieved. The neighbored chips communicate with each other through a shorter circuitry and the top bottom neighbored chips also communicate with a shorter circuitry. A flexible circuit board is prepared, the flexible circuit board has electrical circuitry thereon. The circuitry of the flexible circuit board has a first end electrically coupled to the second circuitry of the second redistribution layer and has a second end electrically coupled to system board or additional electronic devices.

Figure 1:
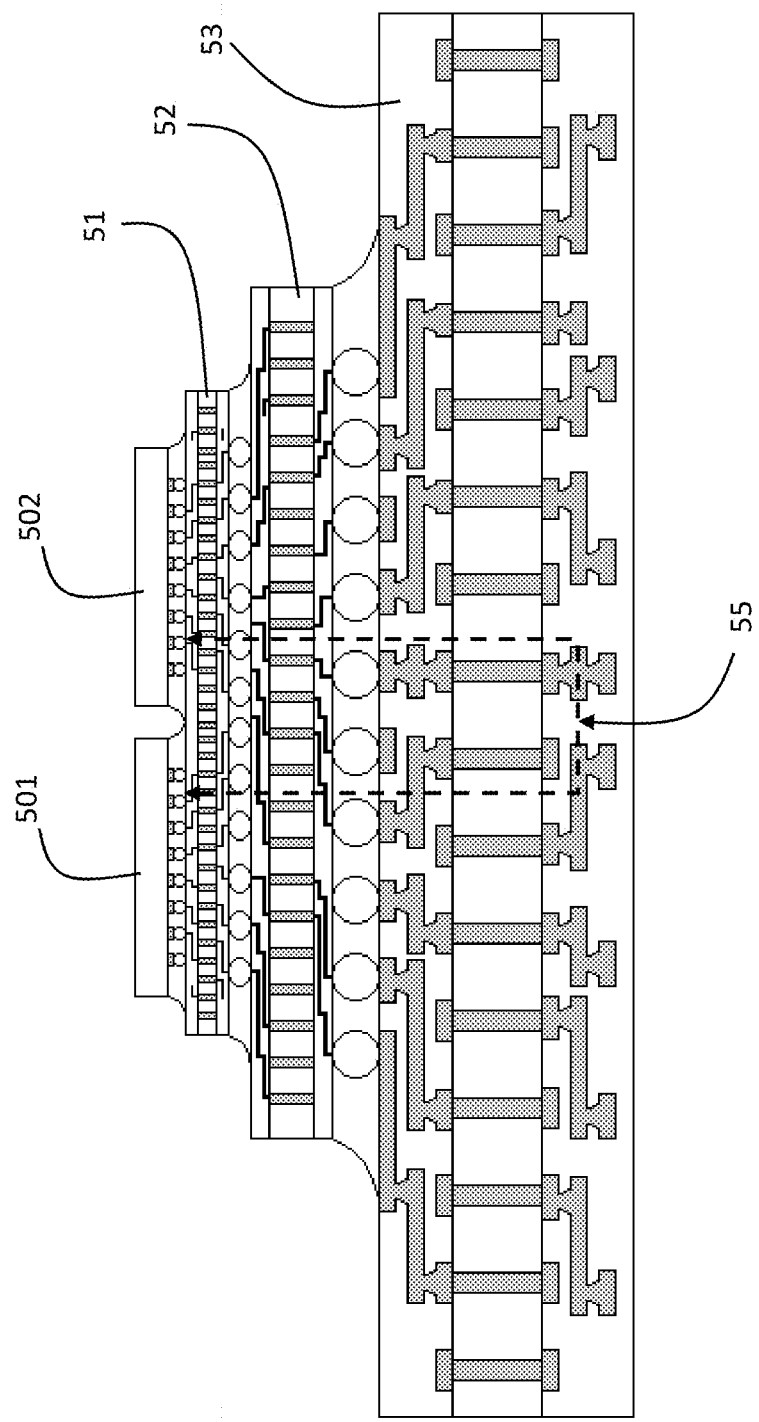
FIG. 1 shows a prior art.
Figure 2:
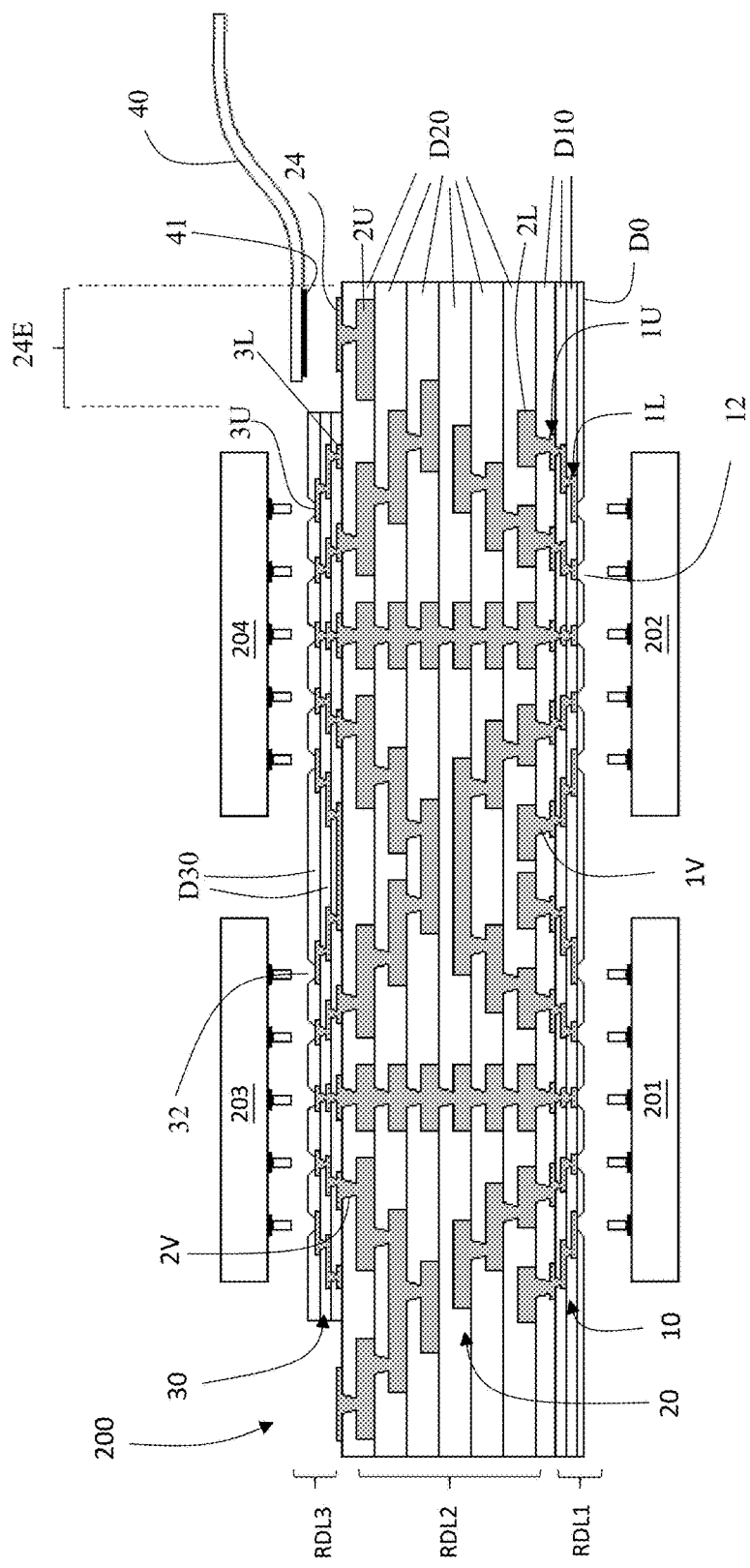
FIG. 2 shows an embodiment according to the present invention.

FIG. 2 shows a first embodiment according to the present invention.

FIG. 2 shows a package substrate 200 which has a middle redistribution layer RDL2. The middle redistribution layer RDL2 is sandwiched by a bottom redistribution layer RDL1 and a top redistribution layer RDL3.

The first redistribution layer RDL1 is fabricated according semiconductor process. The first redistribution layer RDL1 has a first circuitry 10 embedded in a plurality of first dielectric layers D10; the first circuitry 10 comprises a plurality of first upper metal pads 1U configured on a top side of the first redistribution layer RDL1, and a plurality of first lower metal pads 1L configured on a bottom side of the first redistribution layer RDL1; a density of the first lower metal pads 1L is higher than a density of the first upper metal pads 1U; a bottom side of the first lower metal pads 1L is adaptive to mount at least one chip; a first chip 201 and a second chip 202 are, for example, mounted on the bottom surface of the first redistribution layer RDL1.

A second redistribution layer RDL2, fabricated according to lamination process of printed circuit board, is configured on a top side of the first redistribution layer RDL1, having a second circuitry 20 embedded in a plurality of second dielectric layers D20; the second circuitry 20 comprises: a plurality of second upper metal pads 2U configured on a top side of the second redistribution layer RDL2 and a plurality of second lower metal pads 2L configured on a bottom side of the second redistribution layer RDL2; the second circuitry 20 is electrically coupled to the first circuitry 10.

A third redistribution layer RDL3, fabricated according semiconductor process, is configured on a top side of the second redistribution layer RDL2, having a third circuitry 30 embedded in a plurality of third dielectric layers D30; the third circuitry 30 is electrically coupled to the second circuitry 20; the third circuitry 30 comprises a plurality of third upper metal pads 3L configured on a top side of the third redistribution layer RDL3, and a plurality of third lower metal pads 3L configured on a bottom side of the third redistribution layer RDL3; a density of the third upper metal pads 3U is higher than a density of the third lower metal pads 3L; a top side of the third upper metal pads 3U is adaptive to mount at least one chip; a third chip 203 and a four chip 204 are mounted on a top surface of the third redistribution layer RDL3 as an example.

A line width of each circuit of the second circuitry 20 is at least two times wider than a line width of each circuit of the first circuitry 10; and a line width of each circuit of the second circuitry 20 is at least two times wider than a line width of each circuit of the third circuitry 30.

Each of the first upper metal pad 1U is electrically coupled to a corresponding one of the second lower metal pads 2L through a corresponding first metal via 1V. Each of the third lower metal pads 3L is electrically coupled to a corresponding one of the second upper metal pads 2U has a plurality of top metal pads for at least one chip to mount through a corresponding second metal via 2V.

The second redistribution layer RDL2 has an extended portion 24E extending beyond a lateral side of the third redistribution layer RDL3; and at least one connection metal pad 24 is exposed on a top side of the extended portion 24E of the second redistribution layer RDL2.

A flexible circuit board 40 is prepared for electrically coupling the package substrate to a control system or a further electronic system, having at least a metal pad 41 adaptive to electrically couple to the at least one top metal pad 24.

FIGS. 3A~3G show a fabricating process for the embodiment according the present invention.

Figure 3A:
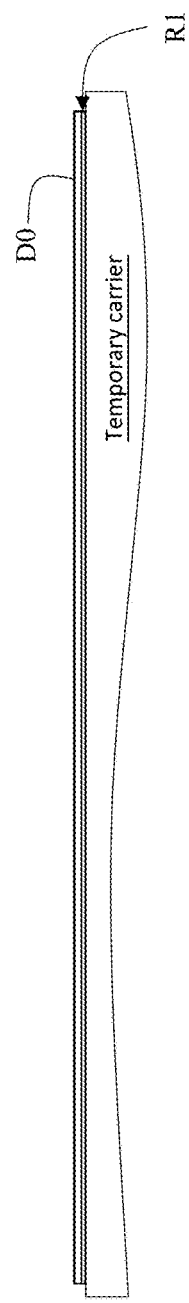
FIGS. 3A~3G show a fabricating process for the embodiment according to the present invention.
Figure 3B:
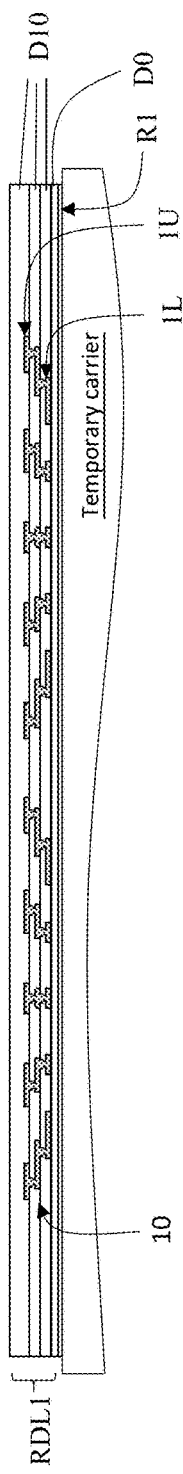
Figure 3C:
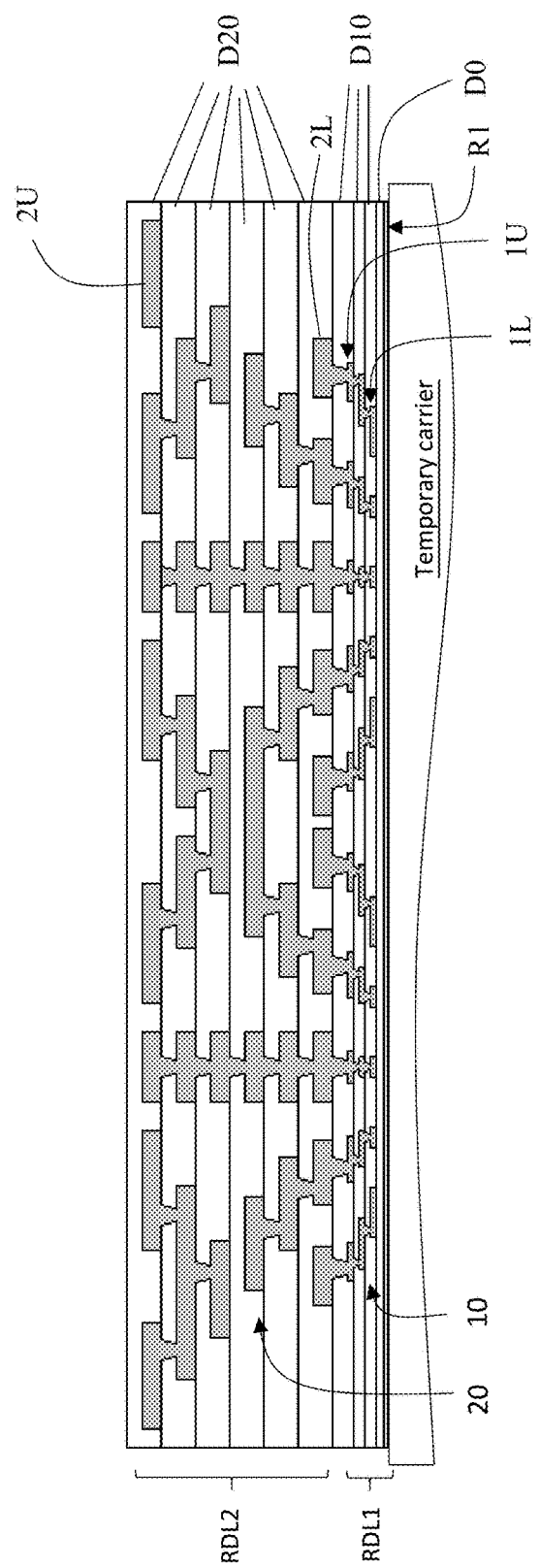
Figure 3D:
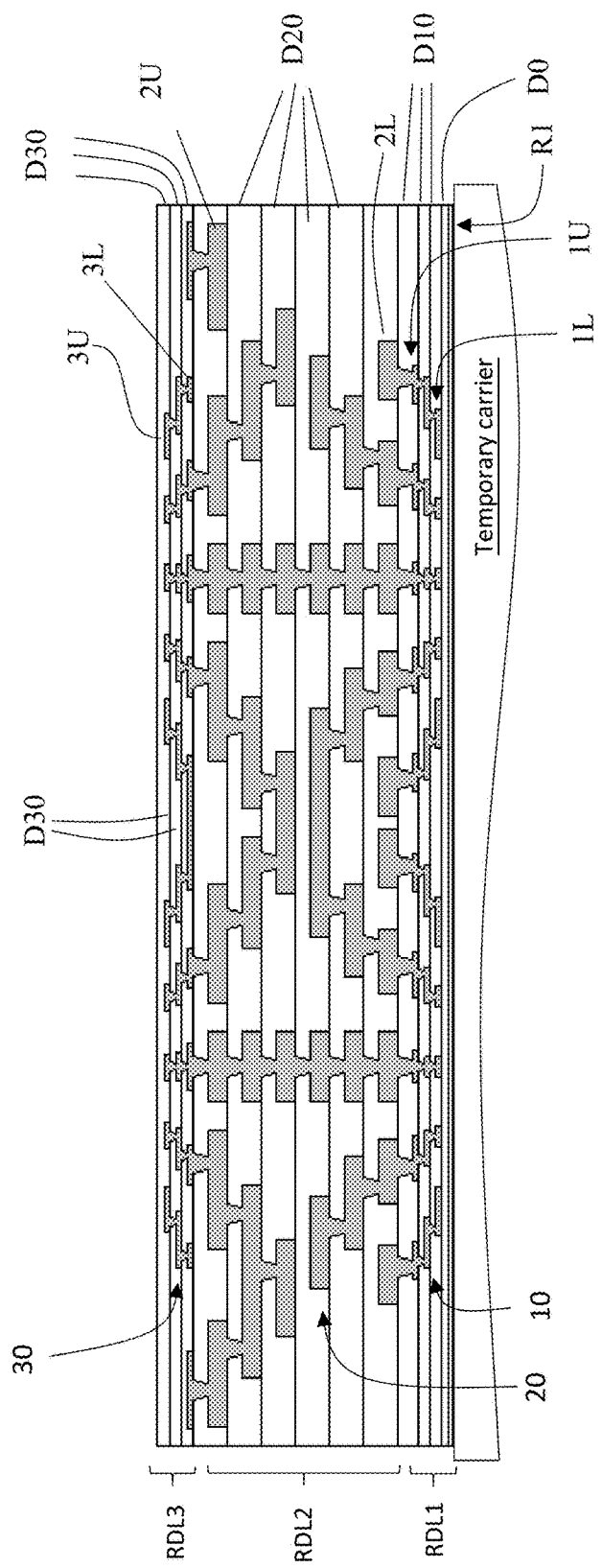

A fabrication process for making a package substrate for double sided chips package, comprises the following steps:

FIG. 3A shows: preparing a temporary carrier, with a release layer R1 on a top surface of the temporary carrier; and with a base dielectric layer DO on a top surface of the release layer R1;

FIG. 3B shows: forming a first redistribution layer RDL1, according to semiconductor design rules, on a top surface of the base dielectric layer DO; the RDL1 comprises a first circuitry 10 embedded in a plurality of first dielectric layers D10;

FIG. 3C shows: forming a second redistribution layer RDL2, according to printed circuit board design rules, on a top surface of the first redistribution layer RDL1; the RDL2 comprises a second circuitry 20 embedded in a plurality of second dielectric layers D20;

FIG. 3D shows: forming a third redistribution layer RDL3, according to semiconductor design rules, on a top surface of the second redistribution layer RDL3; the RDL3 comprises a third circuitry 30 embedded in a plurality of third dielectric layers D30; wherein a line width of each circuit of the second circuitry 20 is at least two times wider than a line width of each circuit of the first circuitry 10; and a line width of each circuit of the second circuitry 20 is at least two times wider than a line width of each circuit of the third circuitry 30.

Figure 3E:
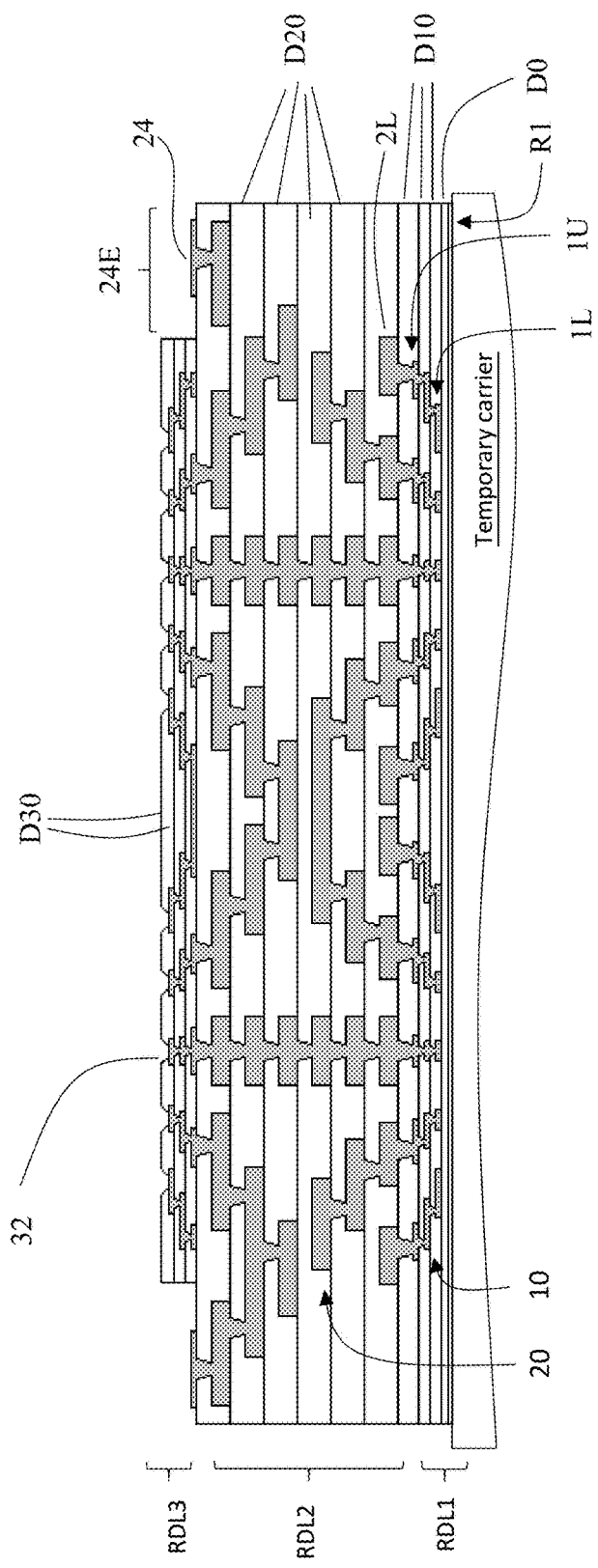

FIG. 3E shows: etching a portion of one of the first dielectric layer D10 from a lateral side to exposed a top surface of the second redistribution layer RDL2 and expose at least one contact metal pad 24 on a top surface of the second redistribution layer RDL2, and etching a plurality of top openings 32 to expose corresponding third upper metal pads 3U.

Figure 3F:
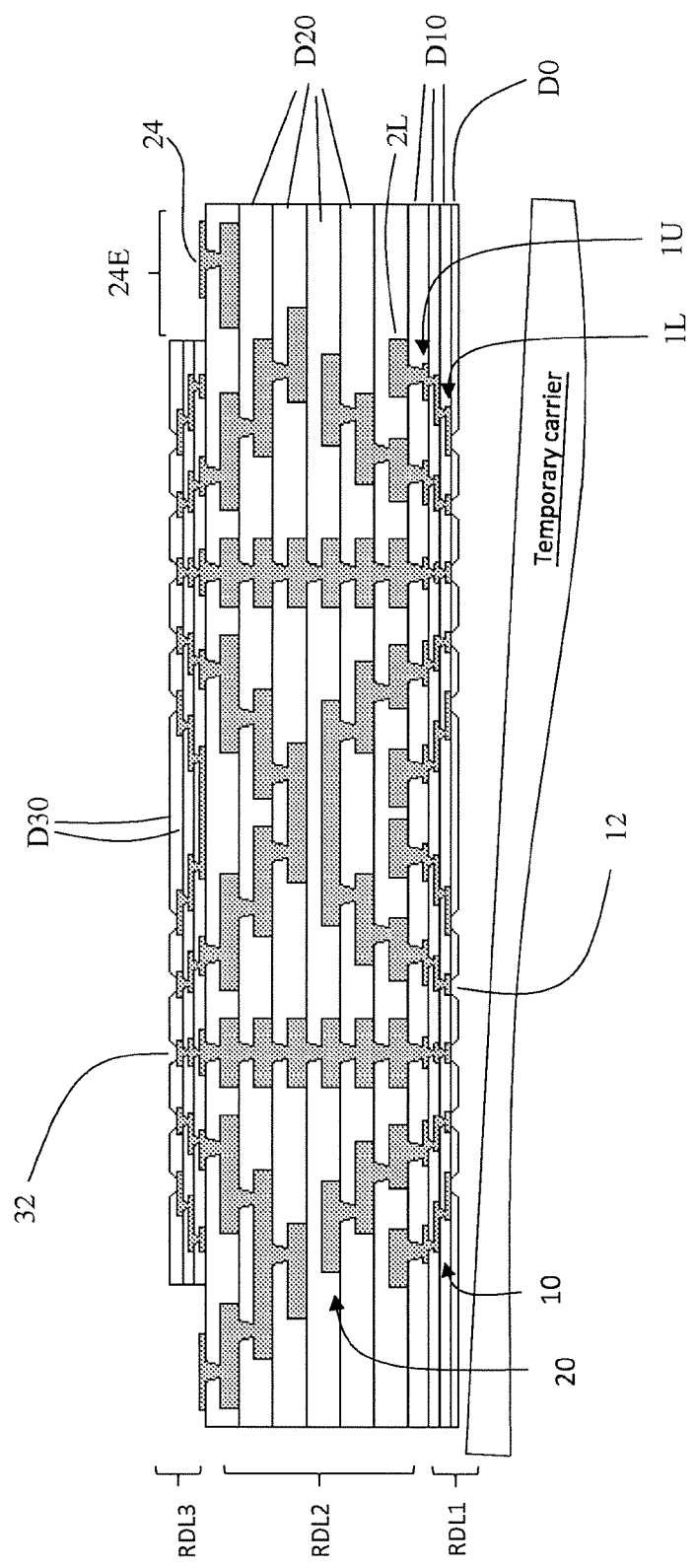

FIG. 3F shows: removing the temporary carrier, removing the release layer R1, and forming a plurality of bottom opening 12 to expose corresponding metal pads 1L.

Figure 3G:
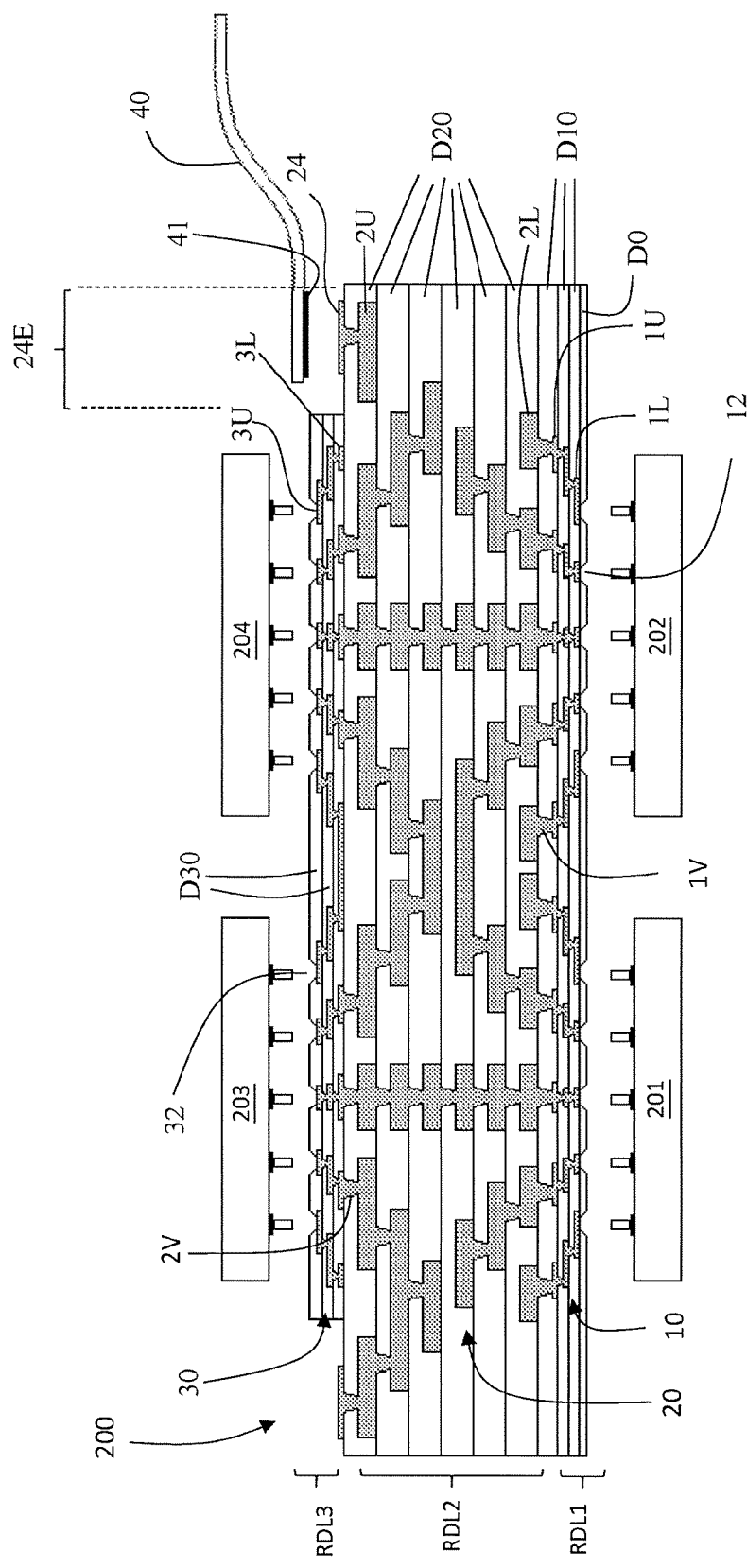

FIG. 3G shows: preparing a flexible circuit board, the flexible circuit board comprises at least a metal pad 41 adaptive to electrically couple to the at least one top metal pad 24 exposed on the extended portion of the second redistribution layer RDL2; mounting chips 201, 202 on a bottom surface of the first redistribution layer RDL1, and mounting chips 203, 204 on a top surface of the third redistribution layer RDL3.

While several embodiments have been described by way of example, it will be apparent to those skilled in the art that various modifications may be configured without departs from the spirit of the present invention. Such modifications are all within the scope of the present invention, as defined by the appended claims.

| Numerical system |
| --- |
| package substrate 200 |
| first redistribution layer RDL1 |
| first circuitry 10 |
| first upper metal pads 1U |
| first lower metal pads 1L |
| first dielectric layers D10 |
| Chip 201, 202, 203, 204 |
| second redistribution layer RDL2 |
| second circuitry 20 |
| second upper metal pads 2U |

| Numerical system |
| --- |
| second lower metal pads 2L |
| second dielectric layers D20 |
| third redistribution layer RDL3 |
| third circuitry 30 |
| third upper metal pads 3U |
| third lower metal pads 3L |
| third dielectric layers D30 |
| first metal via 1V |
| second metal via 2V |
| connection metal pad 24 |
| extended portion 24E |
| flexible circuit board 40 |
| metal pad 41 |

What is claimed is:

1. A package substrate with double sided fine line RDL, comprises:

a first redistribution layer, having a first circuitry embedded in a plurality of first dielectric layers; the first circuitry comprises a plurality of first upper metal pads configured on a top side of the first redistribution layer, and a plurality of first lower metal pads configured on a bottom side of the first redistribution layer; a density of the first lower metal pads is higher than a density of the first upper metal pads; a bottom side of the first lower metal pads is adaptive to mount at least one chip;

a second redistribution layer, configured on a top side of the first redistribution layer, having a second circuitry embedded in a plurality of second dielectric layers; the second circuitry comprises: a plurality of second upper metal pads configured on a top side of the second redistribution layer and a plurality of second lower metal pads configured on a bottom side of the second redistribution layer; the second circuitry is electrically coupled to the first circuitry through a plurality of first metal vias;

a third redistribution layer, configured on a top side of the second redistribution layer, having a third circuitry embedded in a plurality of third dielectric layers; the third circuitry is electrically coupled to the second circuitry through a plurality of second metal vias; the third circuitry comprises a plurality of third upper metal pads configured on a top side of the third redistribution layer, and a plurality of third lower metal pads configured on a bottom side of the third redistribution layer; a density of the third upper metal pads is higher than a density of the third lower metal pads; a top side of the third upper metal pads is adaptive to mount at least one chip; wherein a line width of each circuit of the second circuitry is wider than a line width of each circuit of the first circuitry; and a line width of each circuit of the second circuitry is wider than a line width of each circuit of the third circuitry.

2. A package substrate as claimed in claim 1, wherein each of the first upper metal pads is electrically coupled to a corresponding second lower metal pads through a corresponding bottom metal via; and each of the third lower metal pads is electrically coupled to a corresponding second upper metal pads through a corresponding top metal via.

3. A package substrate as claimed in claim 2, wherein
the second redistribution layer has an extended portion extending beyond a lateral side of one of the first redistribution layer and the third redistribution layer; and
at least one connection metal pad exposed on a top side of the extended portion of the second redistribution layer.

4. A package substrate as claimed in claim 3, further comprises:
a flexible circuit board, having at least a metal pad adaptive to electrically couple to the at least one top metal pad exposed on the extended portion of the second redistribution layer.

5. A fabrication process for making a package substrate, comprises:
preparing a temporary carrier, with a release layer on a top surface of the temporary carrier; and with a base dielectric layer on a top surface of the release layer;
forming a first redistribution layer on a top surface of the base dielectric layer;
forming a second redistribution layer on a top surface of the first redistribution layer;
forming a third redistribution layer on a top surface of the second redistribution layer; wherein a line width of each circuit of the second circuitry is at least two times wider than a line width of each circuit of the first circuitry; and a line width of each circuit of the second circuitry is at least two times wider than a line width of each circuit of the third circuitry.

6. A fabrication process for making a package substrate as claimed in claim 5, further comprises:
etching a portion of one of the first dielectric layer and the third dielectric layer from a lateral side to exposed a top surface of the second redistribution layer and expose at least one contact metal pad exposed on a top surface of the second redistribution layer.

7. A fabrication process for making a package substrate as claimed in claim 6, further comprises:
preparing a flexible circuit board, the flexible circuit board comprising at least a metal pad adaptive to electrically couple to the at least one top metal pad exposed on the extended portion of the second redistribution layer.

* * * * *